(12) United States Patent
Chiang et al.

(10) Patent No.: US 12,243,619 B2
(45) Date of Patent: Mar. 4, 2025

(54) MEMORY ARRAY STRUCTURE

(71) Applicant: Taiwan Semiconductor Manufacturing Company Ltd., Hsinchu (TW)

(72) Inventors: Hung-Li Chiang, Taipei (TW); Jer-Fu Wang, Taipei (TW); Tzu-Chiang Chen, Hsinchu (TW); Meng-Fan Chang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 184 days.

(21) Appl. No.: 17/863,201

(22) Filed: Jul. 12, 2022

(65) Prior Publication Data

US 2024/0021226 A1    Jan. 18, 2024

(51) Int. Cl.
*H03M 1/12* (2006.01)
*G11C 7/10* (2006.01)
*G11C 7/16* (2006.01)
*G11C 13/00* (2006.01)

(52) U.S. Cl.
CPC .............. *G11C 7/16* (2013.01); *G11C 7/1006* (2013.01); *G11C 13/003* (2013.01); *G11C 2213/77* (2013.01); *H03M 1/12* (2013.01)

(58) Field of Classification Search
CPC .......... G11C 7/16; G11C 7/1006; H03M 1/12
USPC ........................................................ 341/155
See application file for complete search history.

(56) References Cited

U.S. PATENT DOCUMENTS

| 9,257,522 B2* | 2/2016 | Lu ....................... G11C 11/4097 |
| 2010/0128519 A1 | 5/2010 | Li et al. |
| 2015/0364191 A1* | 12/2015 | Muralimanohar ..... G11C 16/10 365/163 |
| 2018/0090203 A1* | 3/2018 | Czornomaz ........ G11C 13/0004 |
| 2022/0366976 A1* | 11/2022 | Hwang .................. G11C 5/147 |

OTHER PUBLICATIONS

Office Action issued in connection with Taiwan Appl. No. 112100898 dated Dec. 1, 2023.

* cited by examiner

*Primary Examiner* — Peguy Jean Pierre
(74) *Attorney, Agent, or Firm* — FOLEY & LARDNER LLP (57) ABSTRACT

In some aspects of the present disclosure, a memory array structure is disclosed. In some embodiments, the memory array structure includes a word array. In some embodiments, the word array stores an N-bit word. In some embodiments, the word array includes a plurality of first memory structures and a plurality of second memory structures. In some embodiments, each first memory structure includes a first transistor and a first memory element. In some embodiments, each second memory structure includes a second transistor and a plurality of second memory elements, each second memory element includes a first end and a second end, the first end of each second memory element is coupled to a corresponding bit line, and the second end of each second memory element is coupled to a first end of the second transistor.

20 Claims, 7 Drawing Sheets

MEMORY ARRAY STRUCTURE

BACKGROUND

Artificial intelligence and machine learning applications are driving the need for better memory performance, capacity, and power efficiency, challenging memory system designers on multiple fronts all at the same time. While part of the improvement in performance and model size has been driven by silicon improvements due to Moore's Law, the challenge is that Moore's Law is slowing. This makes it harder to continue achieving these types of performance increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, bits are monolithically stored in corresponding one-transistor-one-resistor (1T1R) structures. Since the transistor occupies the most area in the 1T1R structure, such a design may not be spatially efficient. In other words, too many transistors in an implementation of memory array can reduce spatial efficiency and density of the memory array.

Disclosed herein are embodiments of a memory structure that includes two types of structures for storing bits and a method for operating the same. In some embodiments, the structure includes one or more single-memory-element structures and one or more multiple-memory-element structures. In some embodiments, some bits, such as least significant bits (LSB), are stored using the one or more multiple-memory-element structures, while other bits, such as most significant bits (MSB), are stored using the one or more single-memory-element structures. Such an arrangement can take advantage of the fact that accuracy requirement for LSBs is less stringent than the accuracy requirements of MSBs. In addition, by increasing a memory-element-to-transistor ratio of the memory structure, such an arrangement can store bits in a way that saves space and increases density. Some embodiments of the multiple-memory-element structure include n selectors which prevent a leakage path from inadvertently writing to a memory element in the multiple-memory-element structure.

Embodiments of the memory structure and method disclosed herein can be suitable for various memory elements such as resistors, memristors, and capacitors, and various memory structures such as resistive random-access memory (RRAM), magnetic RAM (MRAM), and phase change RAM (PCRAM), although other memory elements and memory structures are within the scope of the present disclosure. Embodiments of the memory structure and method disclosed herein can be suitable for various applications such as in memory computing (IMC)-related applications (e.g., artificial intelligence, machine learning, neural network training) since these applications are more tolerant of less accurate LSBs, although other applications are within the scope of the present disclosure.

Figure 1:
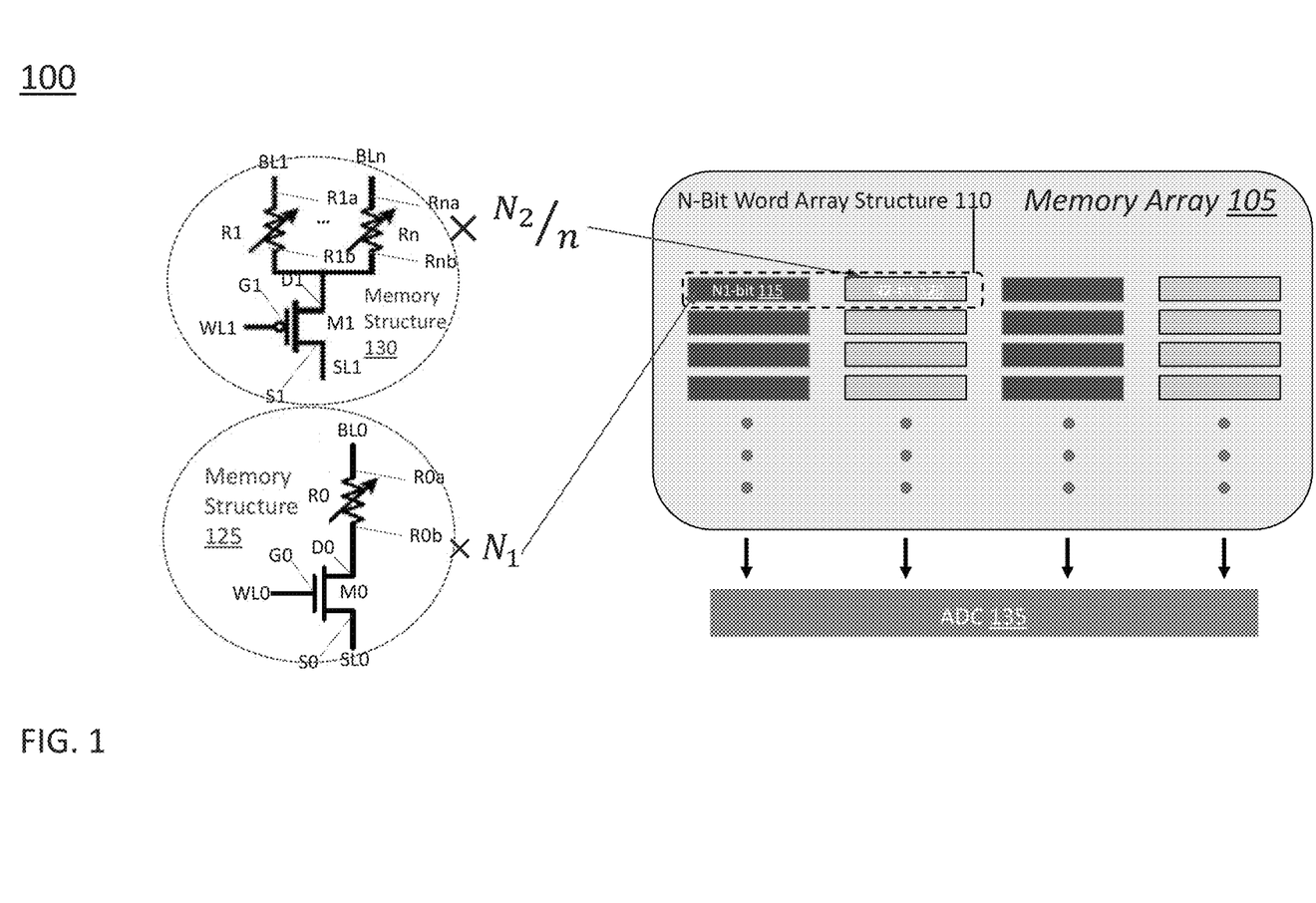
FIG. 1 illustrates a block diagram of a memory array system, in accordance with some embodiments of the present disclosure.

FIG. 1 illustrates a block diagram of a memory array system 100, in accordance with some embodiments of the present disclosure. The memory array system 100 includes a memory array structure 105 and an analog-to-digital converter (ADC) 135 coupled to the memory array structure 105. The memory array structure 105 includes a number of word array structures 110. Each word array structure 110 can store an N-bit word, where N is an integer number. The word array structures 110 can be arranged as an array of rows and columns. As shown in FIG. 1, there are two four rows and two columns of word array structures 110, although a greater or lesser numbers of rows or columns of word array structures 110 are within the scope of the present disclosure.

Each word array structure 110 includes a memory structure 115 and a memory structure 120. The memory structure 115 can store N1 bits and the memory structure 120 can store N2 bits, where N1 is an integer number, N2 is an integer number, and a sum of N1 and N2 is equal to N. In some embodiments, the memory structure 115 stores the most-significant bits (MSB) and the memory structure 120 can store the least-significant bits (LSB). In some embodiments, the memory structure 115 stores the N1 MSB and the memory structure 120 can store the N2 LSB. In some embodiments, each of the memory structures 115 and the memory structures 120 is random-access memory (RAM), static RAM (SRAM), dynamic RAM (DRAM), resistive RAM (RRAM), magnetic RAM (MRAM), phase change RAM (PCRAM), conductive bridge RAM (CBRAM), or any other memory structure suitable for storing bits.

Each memory structure 115 includes a number of memory structures 125. Each memory structure 125 can be referred to as a memory cell or a single-level cell (SLC). In some embodiments, each memory structure 125 can be referred to as a one-transistor-one-resistor (1T1R) memory structure. As shown in FIG. 1, the number of memory structures 125 is N1. Each memory structure 125 can store one bit.

Each memory structure 125 includes a memory element R0. A memory element can be referred to as a storage element. The memory element R0 can store one bit. The memory element R0 can be changed from a first state to a second state in response to a first magnitude of current flowing through the resistor R1. The memory element R0 can include a resistor, a variable resistor, a programmable resistor, a memristor, a variable memristor, a programmable memristor, a capacitor, a variable capacitor, a programmable capacitor, or any other memory element suitable for storing one or more bits.

The memory element R0 includes a first end R0a and a second end R0b. Ends can be referred to as ports or terminals. The first end R0a of the memory element R0 can be coupled to a bit line BL0. The second end R0b of the memory element R0 can be coupled to a transistor M0.

Each memory structure 125 includes a transistor M0. A transistor can be referred to as a device or transistor device. The transistor M0 can be turned on to allow current to flow through R0. The transistor can be a metal-oxide semiconductor field-effect transistor (MOSFET), an n-type MOSFET (an NMOS transistor), a p-type MOSFET (a PMOS transistor), a silicon-on-insulate (SOI) MOSFET, a bipolar junction transistor (BJT), or any other transistor suitable for use in memory structures. An NMOS transistor can be chosen for the transistor M0 for applications where there is more signal loss, such as due to interconnect routing, between the transistor M0 and ground. An NMOS transistor may be advantageous for such applications because the NMOS transistor can incur less loss than a PMOS transistor to couple a node to ground. A PMOS transistor can be chosen for the transistor M0 for applications where there is more signal loss, such as due to interconnect routing, between the transistor M0 and a power rail. A PMOS transistor may be advantageous for such applications because the PMOS transistor can incur less loss than an NMOS transistor to couple to a power rail. An NMOS transistor can be chosen for the transistor M0 for applications where speed is a concern because, in some embodiments, read and write operations are faster using an NMOS transistor than using a PMOS transistor. Specifically, in some embodiments, the mobility of electrons, which are carriers in the case of an NMOS transistor, is about two times greater than that of holes, which are the carriers of the PMOS transistor. A PMOS transistor can be chosen for the transistor M0 for applications where variation, cost, or noise is a concern because, in some embodiments, PMOS technology is highly controllable, low-cost process with good yield and high noise immunity as compared to NMOS technology.

The transistor M0 can be any of various transistor types while remaining within the scope of the present disclosure. The transistor M0 can have a MOSFET device type of standard threshold voltage (SVT), low threshold voltage (LVT), high threshold voltage (HVT), high voltage (HV), input/output (IO), or any of various other MOS device types.

The transistor M0 includes a number of ports. Each of the ports can also be referred to as a terminal. The transistor M0 can include a drain port D0, a source port S0, and a gate port G0. The drain port D0 of the transistor M0 can be coupled to the second end R0b of the memory element R0. The source S0 of the transistor M0 can be coupled to a select line SL0. The gate G0 of the transistor can be coupled to a word line WL0.

A write operation is an operation to write to a memory element such as the memory element R0. One type of write operation is an operation to set a memory element. In some embodiments, setting the memory element R0 includes changing the memory element R0 from a first state a second state. In some embodiments, the memory element R0 has a low-resistance in the first state and a high-resistance in the second state. The low-resistance can include any value such as, but not limited to, values less than 1 kilo-ohm. The high-resistance can include any value such as, but not limited to, values greater than 100 kilo-ohms. The first magnitude of current can include any value such as, but no limited to, values greater than 100 milli-amps.

During a write operation to set the memory element R0, the gate G0 of the transistor M0 receives, through the word line WL0, a write-enable voltage; the source S0 of the transistor M0 receives, through the select line SL0, a ground voltage; and the first end R0a of the memory element R0 receives, through the bit line BL0, a set voltage. In some embodiments, a magnitude of the write-enable voltage is 1.8V, in a range of 1.2V to 2.4V, or any magnitude while in the scope of the present disclosure. In some embodiments, a magnitude of the set voltage is 1V, in a range of 0.75V to 1.25V, or any magnitude while in the scope of the present disclosure. In some embodiments, a magnitude of the ground voltage is 0V, in the range of 0V to 0.1V, or any magnitude while in the scope of the present disclosure. Receiving the write-enable voltage, set voltage, and ground voltage through the WL0, BL0, and SL0, respectively, can cause a current to flow through the memory element R0, which can cause a state of the memory element R0 to change from the first state to the second state.

One type of write operation is an operation to reset a memory element. In some embodiments, setting the memory element R0 includes changing the memory element R0 from the second state to the first state. During a write operation to reset the memory element R0, the gate G0 of the transistor M0 receives, through the word line WL0, the write-enable voltage; the source S0 of the transistor M0 receives, through the select line SL0, the reset voltage; and the first end R0a of the memory element R0 receives, through the bit line BL0, the ground voltage. In some embodiments, a magnitude of the reset voltage is 1V, in a range of 0.75V to 1.25V, or any magnitude while in the scope of the present disclosure. Receiving the write-enable voltage, ground voltage, and reset voltage through the WL0, BL0, and SL0, respectively, can cause a current to flow through the memory element R0, which can cause a state of the memory element R0 to change from the second state to the first state. In some embodiments, the current that causes the memory element R0 to reset is opposite in direction than the current that causes the memory element R0 to set.

During a read operation, the gate G0 of the transistor M0 receives, through the word line WL0, a read-enable voltage; the source S0 of the transistor M0 receives, through the select line SL0, the ground voltage; and the first end R0a of the memory element R0 receives, through the bit line BL0, a read voltage. In some embodiments, a magnitude of the read-enable voltage is 0.75V, in a range of 0.6V to 1V, or any magnitude while in the scope of the present disclosure. In some embodiments, a magnitude of the read voltage is 0.3V, in a range of 0.1V to 0.3V, 0.1V to 1V, or any magnitude while in the scope of the present disclosure. Receiving the read-enable voltage, read voltage, and ground voltage through the WL0, BL0, and SL0, respectively, can cause a current to flow through the bit line BL0 into the ADC 135. The ADC 135 can convert the current into a bit value. For example, a first current corresponding to a low-resistive state of the memory element R0 is converted to a first bit value (e.g., 1) and a second current corresponding to a high-resistive state of the memory element R0 is converted to a second bit value (e.g., 0).

Each memory structure 120 includes a number of memory structures 130. Each memory structure 130 can be referred to as a memory cell or a multi-level cell (MLC). In some embodiments, each memory structure 130 can be referred to as a one-transistor-n-resistor (1TnR) memory structure. As shown in FIG. 1, the number of memory structures 130 is N2/n, where n is a number of memory elements in each memory structure 130. Each memory structure 130 can store n bits.

Each memory structure 130 includes a number of n memory elements R1, . . . , Rn. In some embodiments, each of the n memory elements R1, Rn are similar to the memory element R0. Each memory element can include a first end and a second end. For example, the memory element R1 can include a first end R1a and a second end R1b. Similarly, the memory element Rn can include a first end Rna and a second end Rnb. The first end R1a of the memory element R1 can be coupled to a corresponding bit line BL1. The first end Rna of the memory element Rn can be coupled to a corresponding bit line BLn. The second ends R1b and Rnb of the memory elements R1 and Rn, respectively, can be coupled to a transistor M1. Although FIG. 1 shows two memory elements R1 and Rn, each memory structure 130 can include greater than two memory elements.

Each memory structure 130 includes a transistor M1. In some embodiments, the transistor M1 is similar to the transistor M0. The transistor M1 includes a number of ports. The transistor M1 can include a drain port D1, a source port S1, and a gate port G1. The drain port D1 of the transistor M1 can be coupled to the second end R1b of the memory element R1 and the second end Rnb of the memory element Rn. The source S1 of the transistor M1 can be coupled to a select line SL1. The gate G1 of the transistor can be coupled to a word line WL1.

During a write operation to set the memory element R1, the gate G1 of the transistor M1 receives, through the word line WL1, a write-enable voltage; the source S1 of the transistor M1 receives, through the select line SL1, a ground voltage; the first end R1a of the memory element R1 receives, through the bit line BL1, a set voltage; and the first end Rna of the memory element Rn receives, through the bit line BLn, a half-set voltage. A magnitude of the half-set voltage can be a half of a magnitude of the set voltage. Selecting the magnitude of the half-set voltage to be a half of a magnitude of the set voltage can reduce the risk of inadvertently setting the memory element Rn when setting the memory element R1. In some embodiments, a magnitude of the half-set voltage is 0.5V, in a range of 0.375V to 0.625V, or any magnitude while in the scope of the present disclosure.

During a write operation to reset the memory element R1, the gate G1 of the transistor M1 receives, through the word line WL1, the write-enable voltage; the source S1 of the transistor M1 receives, through the select line SL1, the reset voltage; the first end R1a of the memory element R1 receives, through the bit line BL1, the ground voltage; and the first end Rna of the memory element Rn receives, through the bit line BLn, the half-reset voltage. A magnitude of the half-reset voltage can be a half of a magnitude of the reset voltage. Selecting the magnitude of the half-reset voltage to be a half of a magnitude of the reset voltage can reduce the risk of inadvertently resetting the memory element Rn when resetting the memory element R1. In some embodiments, a magnitude of the half-reset voltage is 0.5V, in a range of 0.375V to 0.625V, or any magnitude while in the scope of the present disclosure.

During a read operation of R1, the gate G1 of the transistor M1 receives, through the word line WL1, a read-enable voltage; the source S1 of the transistor M1 receives, through the select line SL1, the ground voltage; the first end R1a of the memory element R1 receives, through the bit line BL1, a read voltage. In some embodiments, during a read operation of R1, the first end Rna of the memory element Rn receives, through the bit line BLn, the ground voltage. In some embodiments, during a read operation of R1, the ADC 135 is decoupled from, or otherwise disabled from, receiving current from BLn.

The memory array system 100 includes the ADC 135. In some embodiments, each of the memory structures 125 and each of the memory structures 130 are coupled to the ADC 135. The ADC 135 of FIG. 1 can be referred to as a common ADC or a shared ADC. As shown in FIG. 1, the ADC 135 can receive currents corresponding to each of the bits in an N-bit word.

Figure 2A:
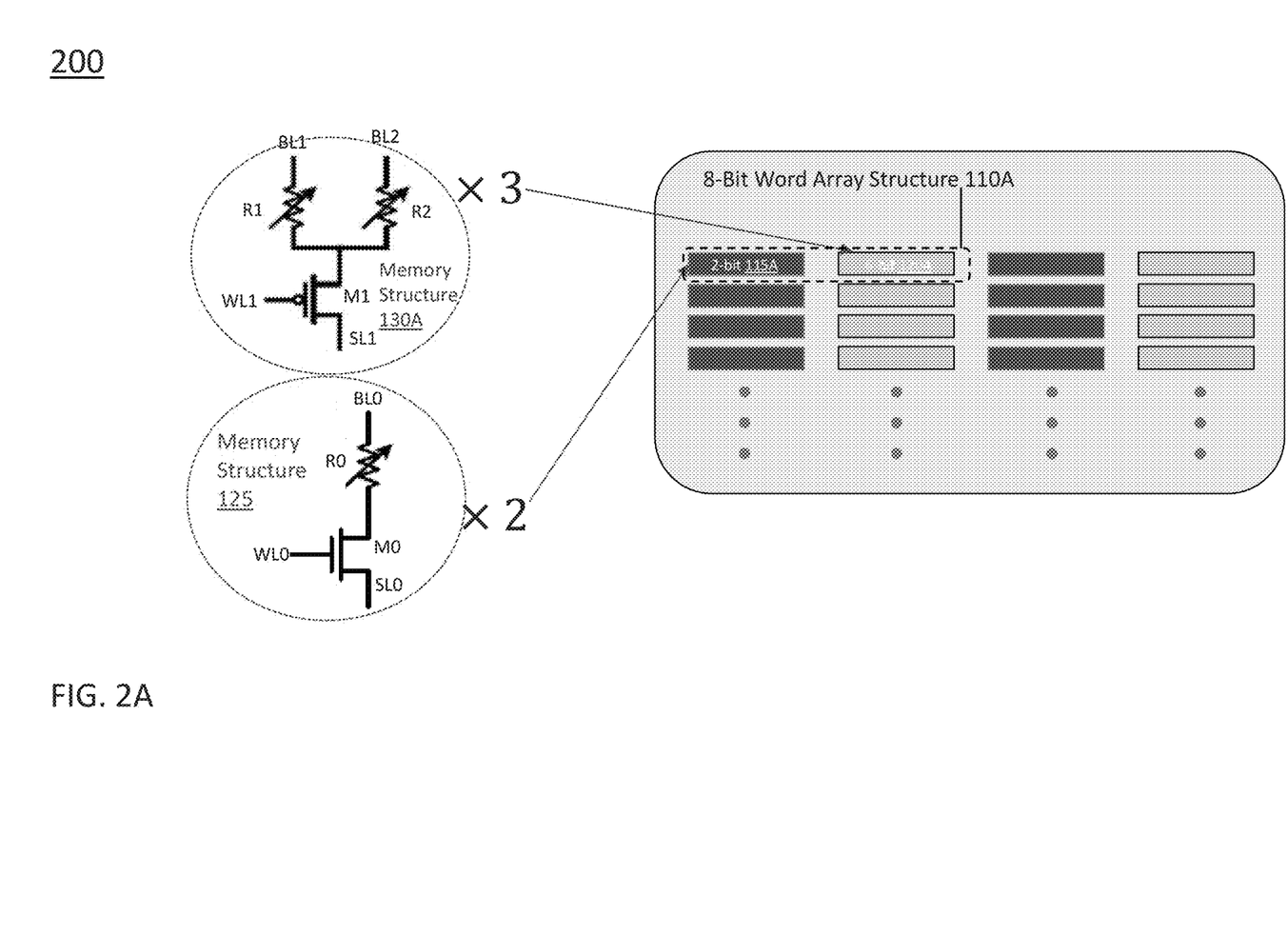
FIGS. 2A-2C each illustrate a block diagram of a corresponding implementation of the memory array structure of FIG. 1, in accordance with some embodiments of the present disclosure.
Figure 2B:
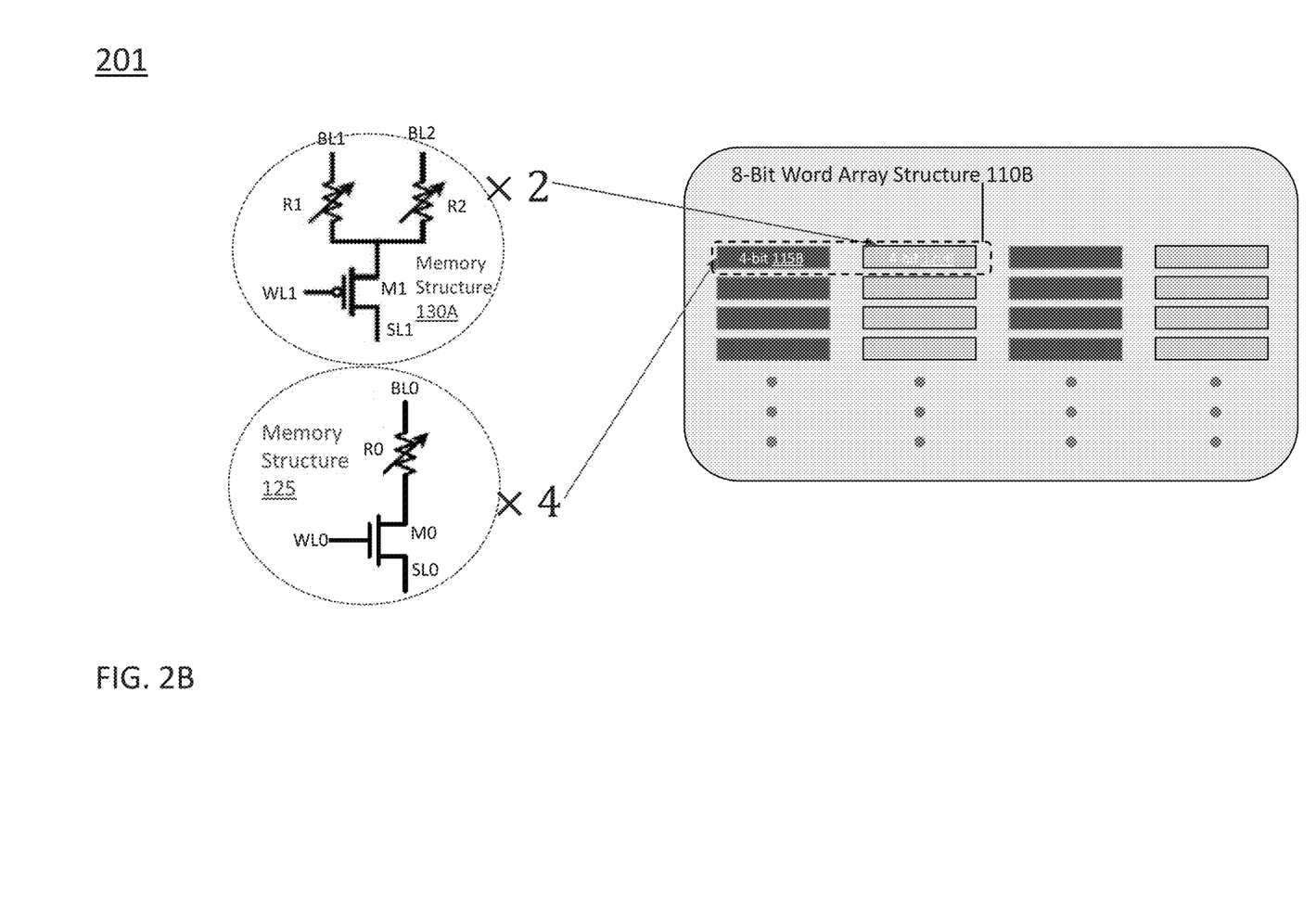
Figure 2C:
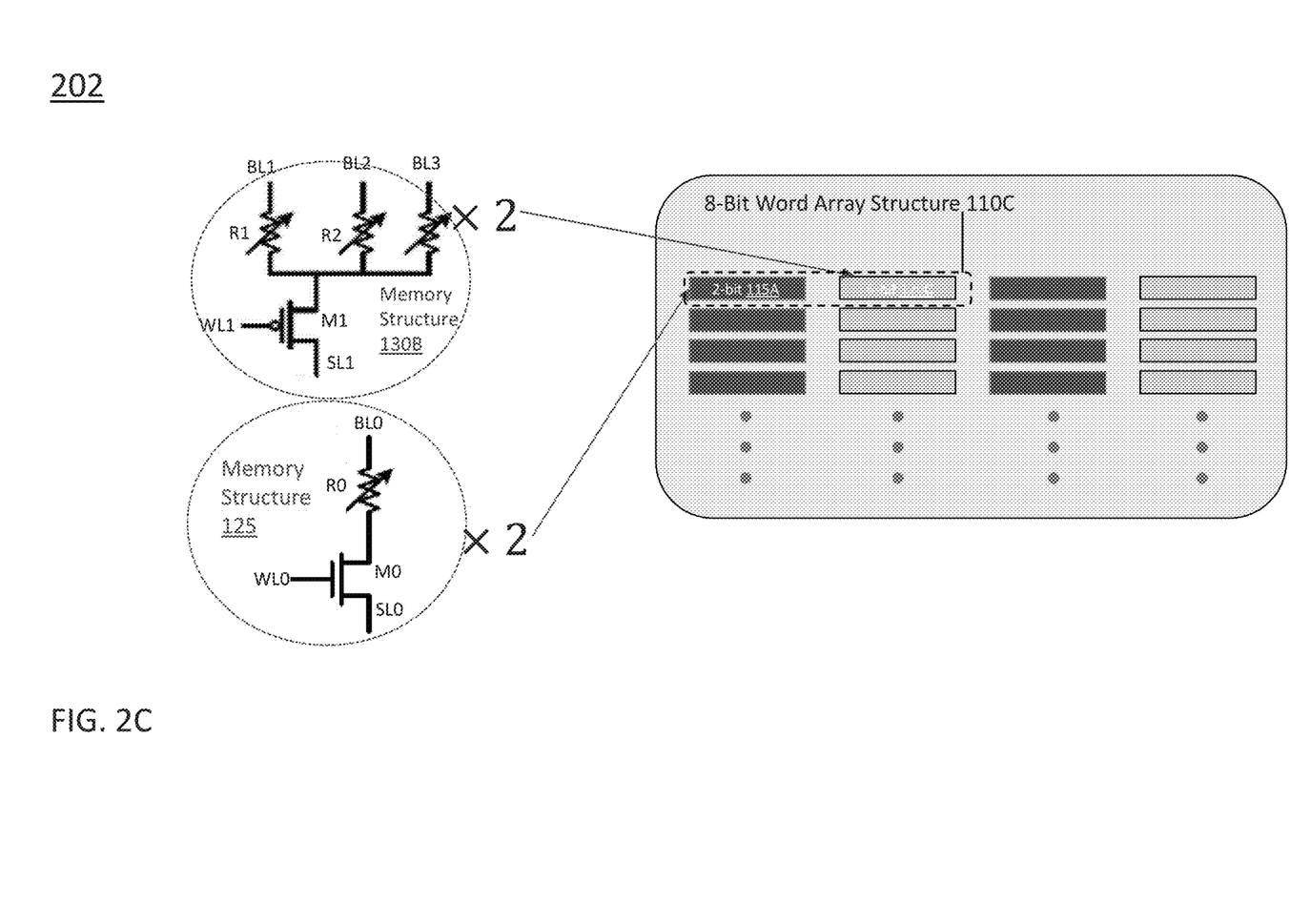

FIGS. 2A-2C each illustrate a block diagram of a corresponding implementation of the memory array structure 105 of FIG. 1, in accordance with some embodiments of the present disclosure. FIG. 2A illustrates a block diagram of a memory array structure 200, in accordance with some embodiments of the present disclosure. The memory array structure 200 includes a number of word array structures 110A. Each of the word array structures 110A can store eight bits. Each word array structure 110A can be an implementation of the word array structure 110 of FIG. 1. Each word array structure 110A includes a memory structure 115A and a memory structure 120A. The memory structure 115A can store two bits and the memory structure 120A can store six bits. Each memory structure 115A can be an implementation of the memory structure 115 of FIG. 1 and the memory structure 120A can be an implementation of the memory structure 120 of FIG. 1. Each memory structure 115A includes two memory structures 125 of FIG. 1.

Each memory structure 120A includes three memory structures 130A. Each memory structure 130A can be an implementation of the memory structure 130 of FIG. 1 that has two memory elements, R1 and R2, coupled to two corresponding bit lines, BL1 and BL2, respectively.

FIG. 2B illustrates a block diagram of a memory array structure 201, in accordance with some embodiments of the present disclosure. The memory array structure 201 of FIG. 2B is similar to the memory array structure 200 of FIG. 2A except that the memory array structure 201 has a lower ratio of memory elements to transistors than the memory array structure 200 does. The memory array structure 201 can be used in applications where accuracy requirements of the LSBs are more stringent or greater accuracy of LSBs is preferred over further space reduction.

The memory array structure 201 includes a number of word array structures 110B. Each of the word array structures 110B can store eight bits. Each word array structure 110B can be an implementation of the word array structure 110 of FIG. 1. Each word array structure 110B includes a memory structure 115B and a memory structure 120B. The memory structure 115B can store four bits and the memory structure 120B can store four bits. Each memory structure 115B can be an implementation of the memory structure 115 of FIG. 1 and each memory structure 120B can be an implementation of the memory structure 120 of FIG. 1. Each memory structure 115B includes four memory structures 125 of FIG. 1. Each memory structure 120B includes two memory structures 130A of FIG. 2A.

FIG. 2C illustrates a block diagram of a memory array structure 202, in accordance with some embodiments of the present disclosure. The memory array structure 202 of FIG. 2C is similar to the memory array structure 200 of FIG. 2A except that the memory structure 130B of FIG. 2C has a higher ratio of memory elements to transistors than the memory structure 130A of FIG. 2A does. The memory array structure 202 can be used in applications where accuracy requirements of the LSBs are less stringent or further space reduction is preferred over greater accuracy of LSBs.

The memory array structure 202 includes a number of word array structures 110C. Each of the word array structures 110C can store eight bits. Each word array structure 110C can be an implementation of the word array structure 110 of FIG. 1. Each word array structure 110C includes a memory structure 115A of FIG. 2A and a memory structure 120C. Each memory structure 120C can be an implementation of the memory structure 120 of FIG. 1. The memory structure 115A can store two bits and the memory structure 120C can store six bits.

Each memory structure 120C includes two memory structures 130B. Each memory structure 130B can be an implementation of the memory structure 130 of FIG. 1 that has three memory elements, R1, R2, and R3, coupled to three corresponding bit lines, BL1, BL2, and BL3, respectively.

Figure 3:
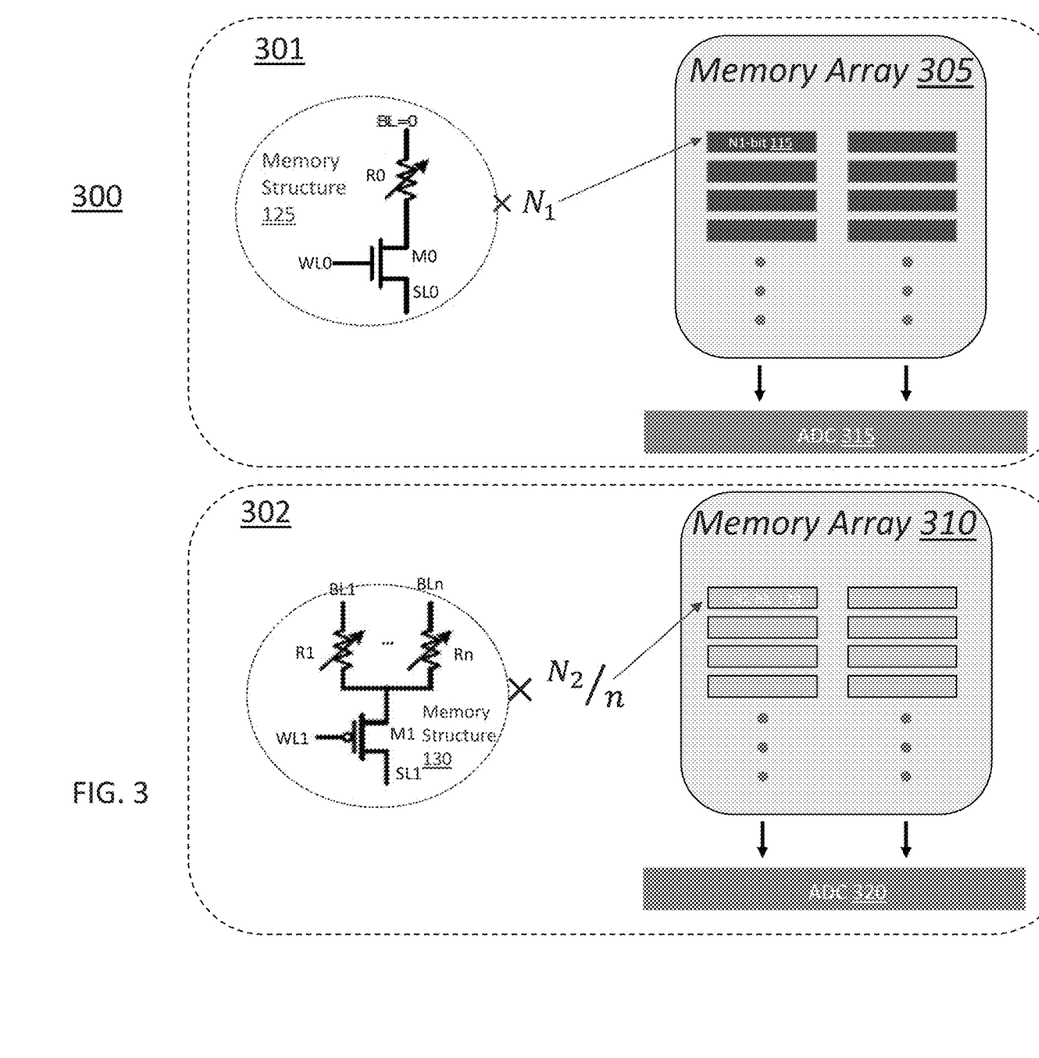
FIG. 3 illustrates a block diagram of another memory array system, in accordance with some embodiments of the present disclosure.

FIG. 3 illustrates a block diagram of a memory array system 300, in accordance with some embodiments of the present disclosure. The memory array system 300 of FIG. 3 is similar to the memory array system 100 of FIG. 1 except that the memory array system 300 has separate memory array sub-systems for the memory structures 125 and the memory structures 130. The memory array system 300 can be used in applications where an ADC uses, or performs more optimally using, different metrics (e.g., different bit resolution, different number of quantization levels or different voltage resolutions) for converting currents from the memory structures 125 than for converting current from the memory structures 130.

The memory array system 300 includes a memory array sub-system 301 and a memory array sub-system 302. The memory array sub-system 301 includes a memory array structure 305 and an ADC 315 coupled to the memory array structure 305. The memory array structure 305 includes a number of memory structures 115 of FIG. 1. The memory array sub-system 302 includes a memory array structure 310 and an ADC 320 coupled to the memory array structure 310. The memory array structure 310 includes a number of memory structures 120 of FIG. 1.

Figure 4:
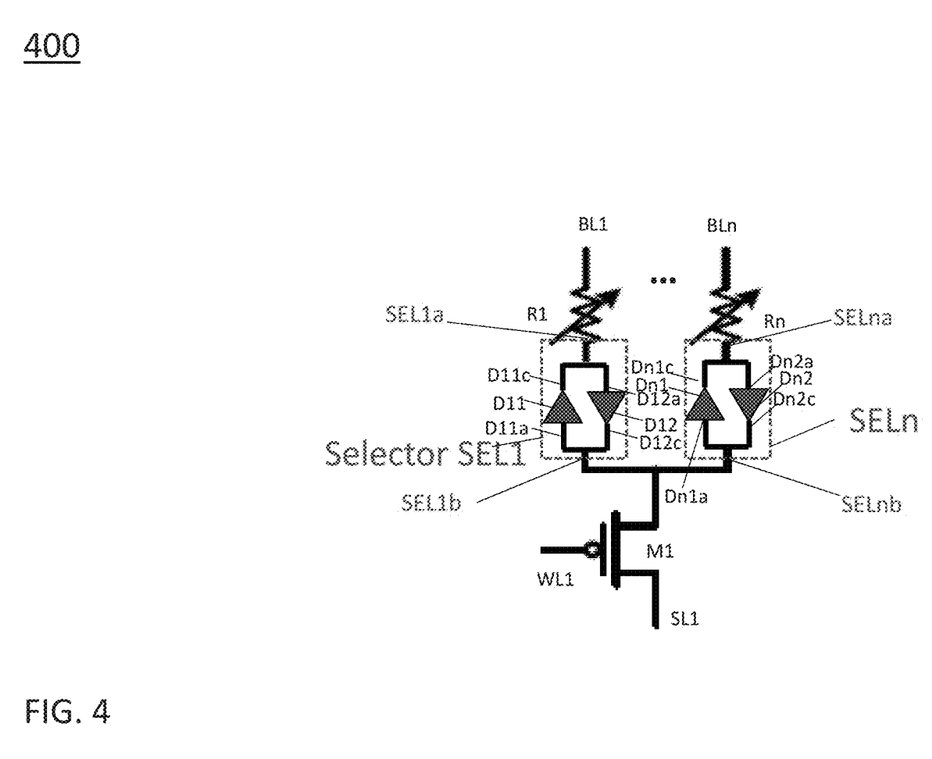
FIG. 4 illustrates a circuit diagram of a selector memory structure, in accordance with some embodiments of the present disclosure.

FIG. 4 illustrates a circuit diagram of a selector memory structure 400. The selector memory structure 400 is similar to the memory structure 130 except that the selector memory structure 400 includes a plurality of selectors. In one embodiment of the memory array system of FIG. 1, a plurality of selector memory structures 400 replaces the plurality of memory structures 130 of FIG. 1. When receiving voltages to write to a first memory element, the selector memory structure 400 can prevent inadvertently writing to a second memory element. In some embodiments, each memory structure 130 can be referred to as a one-transistor-n-selector-resistor (1TnSR) memory structure.

The selector memory structure 400 can include the number of n memory elements R1, Rn, which are similar to R1, Rn of the memory structure 130 of FIG. 1. The first end R1a of the memory element R1 can be coupled to the corresponding bit line BL1. The first end Rna of the memory element Rn can be coupled to the corresponding bit line BLn. The second end R1b of the memory element R1 can be coupled to a selector SEL1. The second end Rnb of the memory element Rn can be coupled to a selector SELn. Although FIG. 3 shows two memory elements R1 and Rn, each memory structure 130 can include greater than two memory elements.

The selector memory structure 400 can include the number of n selectors SEL1, SELn. Each selector can include a first end and a second end. For example, the selector SEL1 can include a first end SEL1a and a second end SEL1b. Similarly, the selector SELn can include a first end SELna and a second end SELnb. The first end SEL1a of the selector SEL1 can be coupled to the second end R1b of the corresponding memory element R1. The first end SELna of the selector SELn can be coupled to the second end Rnb of the corresponding memory element Rn. The second ends SEL1b and SELnb of the selectors SEL1 and SELn, respectively, can be coupled to the transistor M1. Although FIG. 3 shows two selectors SEL1 and SELn, each memory structure 130 can include greater than two selectors.

Each selector can include a threshold-type selector such as a conductive bridge (CB) selector or voltage conductive bridge (VCB) selector. Each selector can include an exponential-type selector. Each selector can include two cross-coupled diodes. For example, the selector SEL1 can include a diode D11 and a diode D12. Similarly, the selector SELn can include a diode Dn1 and a diode Dn2. Each diode can include an anode and a cathode. For example, the diode D11 can include an anode D11a and a cathode D11c, the diode D12 can include an anode D12a and a cathode D12c, the diode Dn1 can include an anode Dn1a and a cathode Dn1c, and the diode Dn2 can include an anode Dn2a and a cathode Dn2c. The anode D11a of the diode D11 can be coupled to the drain D1 of the transistor M1. The cathode D11c of the diode D11 can be coupled to the second end R1b of the memory element R1. The anode D12a of the diode D12 can be coupled to the second end R1b of the memory element R1. The cathode D12c of the diode D12 can be coupled to the drain D1 of the transistor M1. The anode Dn1a of the diode Dn1 can be coupled to the drain D1 of the transistor M1. The cathode Dn1c of the diode Dn1 can be coupled to the second end Rnb of the memory element Rn. The anode Dn2a of the diode Dn2 can be coupled to the second end Rnb of the memory element Rn. The cathode Dn2c of the diode Dn2 can be coupled to the drain D1 of the transistor M1.

Each selector memory structure 400 can include the transistor M1 which is similar to M1 of the memory structure 130 of FIG. 1. The transistor M1 includes a number of ports. The transistor M1 can include a drain port D1, a source port S1, and a gate port G1. The drain port D1 of the transistor M1 can be coupled to the second end SEL1b of the selector SEL1 and the second end SELnb of the selector SELn. The source S1 of the transistor M1 can be coupled to a select line SL1. The gate G1 of the transistor can be coupled to a word line WL1.

Figure 5:
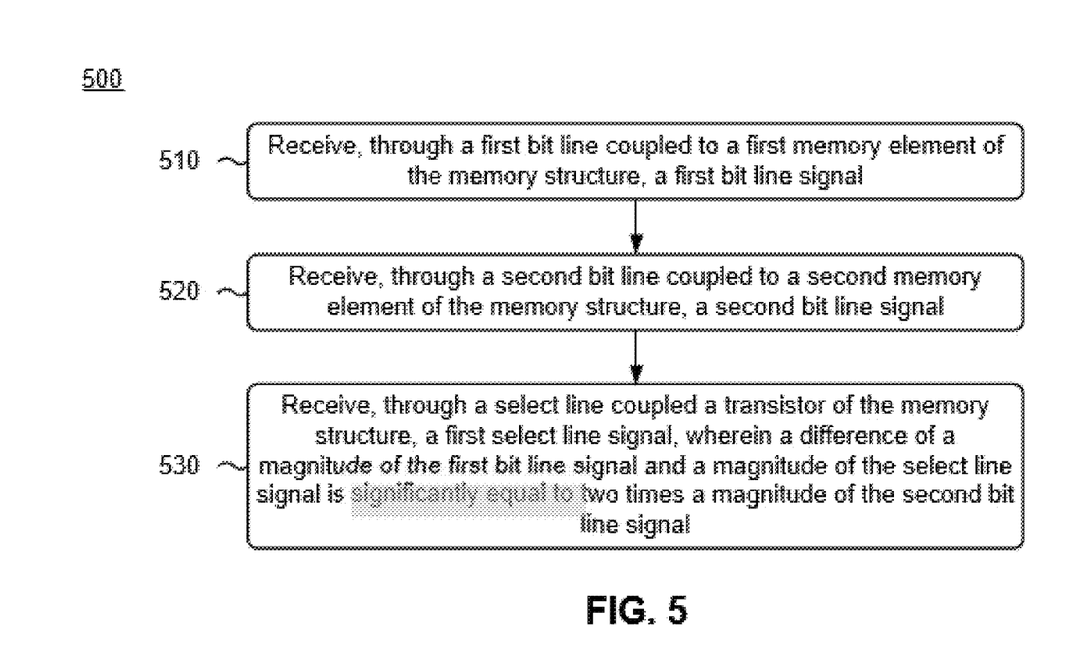
FIG. 5 illustrates a flowchart of a method for operating a memory structure, in accordance with some embodiments of the present disclosure.

FIG. 5 illustrates a flowchart of a method 500 for operating a memory structure, in accordance with some embodiments of the present disclosure. The memory structure can be any of the memory structures in FIGS. 1-4. It is noted that the method 500 is merely an example and is not intended to limit the present disclosure. Accordingly, it is understood that additional operations may be provided before, during, and after the method 500 of FIG. 5, and that some other operations may only be briefly described herein. In some embodiments, the method 500 is performed by the memory structure 130.

At operation 510, the memory structure (e.g., the memory structure 130) receives, through a first bit line (e.g., BL1) coupled to a first memory element (e.g., R1) of the memory structure, a first bit line signal (e.g., a set voltage, a ground voltage, or a read voltage). At operation 520, the memory structure receives, through a second bit line (e.g., BL2) coupled to a second memory element (e.g., R2) of the memory structure, a second bit line signal (e.g., a half-set voltage, a half-reset voltage, or a ground voltage). At operation 530, the memory structure receives, through a select line (e.g., SL1) coupled a transistor (e.g., MD of the memory structure, a first select line signal (e.g., a ground voltage or a reset voltage). In some embodiments, a difference of a magnitude of the first bit line signal and a magnitude of the select line signal is significantly equal to two times a magnitude of the second bit line signal. In some embodiments, a first value significantly equal to a second value is defined as the first value being within a range of 95% to 105% of the second value. In some embodiments, the magnitude of the first bit line signal is greater than the magnitude of the select line signal. In some embodiments, the magnitude of the first bit line signal is less than the magnitude of the select line signal. In some embodiments, the memory structure receives, through a word line (e.g., WL1) coupled the transistor of a memory structure, a write line signal (e.g., a write-enable voltage or a read-enable voltage).

In some embodiments, the memory structure is part of a word array structure (e.g., the word array structure 110 of FIG. 1 or the memory structure 120 of FIG. 1 or FIG. 3). In some embodiments, the word array structure includes a second memory structure. In some embodiments, the second memory word structure receives, through each bit line of the second memory structure, a third bit line signal. In some embodiments, the second memory word structure receives, through a source line of the second memory structure, a second source line signal. In some embodiments, the third bit line signal has a magnitude equal to a magnitude of the second source line signal. In some embodiments, the magnitudes of the second bit line signal and the second source line signal are equal to 0V.

In some embodiments, the memory structure is part of a memory array structure (e.g., the memory array structure 105 of FIG. 1 or the memory array structure 310 of FIG. 1). In some embodiments, the memory array structure includes a third memory structure. In some embodiments, the third memory structure receives, through a word line of the third memory structure, an inhibit signal. In some embodiments, the inhibit signal is 0V.

In some aspects of the present disclosure, a memory array structure is disclosed. In some embodiments, the memory array structure includes a word array. In some embodiments, the word array stores an N-bit word. In some embodiments, the word array includes a plurality of first memory structures and a plurality of second memory structures. In some embodiments, each first memory structure includes a first transistor and a first memory element. In some embodiments, each second memory structure includes a second transistor and a plurality of second memory elements, each second memory element includes a first end and a second end, the first end of each second memory element is coupled to a corresponding bit line, and the second end of each second memory element is coupled to a first end of the second transistor. In some embodiments, the plurality of first memory structures stores a plurality of most significant bits (MSB) of the N-bit word, and the plurality of second memory structures stores least significant bits (LSB) of the N-bit word.

In some embodiments, the plurality of first memory structures stores a number of first bits of the N-bit word, the plurality of second memory structures stores a number of second bits of the N-bit word. In some embodiments, the number of first bits is less than the number of second bits. In some embodiments, the number of first bits is equal to the number of second bits. In some embodiments, the plurality of second memory elements includes three second memory elements. In some embodiments, each of the plurality of second memory elements includes a memristor.

In some embodiments, the plurality of first memory structures and the plurality of second memory structures are coupled to a common analog-to-digital converter (ADC). In some embodiments, the plurality of first memory structures is coupled to a first analog-to-digital converter (ADC) and the plurality of second memory structures is coupled to a second ADC.

In some embodiments, each second memory structure further includes a plurality of selectors, and each selector is coupled between the second end of the corresponding second memory element and the first end of the second transistor. In some embodiments, each selector includes a first diode and a second diode. In some embodiments, the first diode includes a first anode coupled to the second end of the corresponding second memory element and a first cathode coupled to the first end of the second transistor. In some embodiments, the second diode includes a second cathode coupled to the second end of the corresponding second memory element and a second anode coupled to the first end of the second transistor.

In some aspects of the present disclosure, a memory array structure is disclosed. In some embodiments, the memory array structure includes a word array. In some embodiments, the word array stores an N-bit word. In some embodiments, the word array includes a plurality of first memory structures and a plurality of second memory structures. In some embodiments, each first memory structure includes a first transistor and a first memory element, the first transistor is coupled to a first select line, and the first memory element is coupled to a first bit line. In some embodiments, each second memory structure includes a second transistor and a plurality of second memory elements, each second memory element is coupled to a corresponding second bit line, and the second transistor is coupled to a second select line.

In some embodiments, the plurality of first memory structures stores a plurality of most significant bits (MSB) of the N-bit word, and the plurality of second memory structures stores least significant bits (LSB) of the N-bit word. In some embodiments, the plurality of first memory structures stores a number of first bits of the N-bit word, the plurality of second memory structures stores a number of second bits of the N-bit word, and the number of first bits is less than the number of second bits. In some embodiments, each of the plurality of second memory elements includes a memristor.

In some embodiments, the plurality of first memory structures and the plurality of second memory structures are coupled to a common analog-to-digital converter (ADC). In some embodiments, the plurality of first memory structures is coupled to a first analog-to-digital converter (ADC) and the plurality of second memory structures is coupled to a second ADC. In some embodiments, each second memory structure further includes a plurality of selectors, each selector is coupled between the corresponding second memory element and the second transistor.

In some aspects of the present disclosure, a method for operating a memory structure is disclosed. In some embodiments, the method includes receiving, through a first bit line coupled to a first memory element of the memory structure, a first bit line signal. In some embodiments, the method includes receiving, through a second bit line coupled to a second memory element of the memory structure, a second bit line signal. In some embodiments, the method includes receiving, through a select line coupled a transistor of the memory structure, a first select line signal.

In some embodiments, a difference of a magnitude of the first bit line signal and a magnitude of the select line signal is significantly equal to two times a magnitude of the second bit line signal. In some embodiments, the magnitude of the first bit line signal is greater than the magnitude of the select line signal. In some embodiments, the magnitude of the first bit line signal is less than the magnitude of the select line signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array structure, comprising:
   a word array, storing an N-bit word and comprising:
      a plurality of first memory structures, wherein each first memory structure comprises a first transistor and a first memory element; and
      a plurality of second memory structures, wherein each second memory structure comprises a second transistor and a plurality of second memory elements, each second memory element comprises a first end and a second end, the first end of each second memory element is coupled to a corresponding bit line, and the second end of each second memory element is coupled to a first end of the second transistor,
      wherein each second memory structure further comprises a plurality of selectors, and each selector is coupled between the second end of the corresponding second memory element and the first end of the second transistor.

2. The memory array structure of claim 1, wherein the plurality of first memory structures stores a plurality of most significant bits (MSB) of the N-bit word, and the plurality of second memory structures stores least significant bits (LSB) of the N-bit word.

3. The memory array structure of claim 1, wherein the plurality of first memory structures stores a number of first bits of the N-bit word, the plurality of second memory structures stores a number of second bits of the N-bit word, and the number of first bits is less than the number of second bits.

4. The memory array structure of claim 1, wherein the plurality of first memory structures stores a number of first bits of the N-bit word, the plurality of second memory structures stores a number of second bits of the N-bit word, and the number of first bits is equal to the number of second bits.

5. The memory array structure of claim 1, wherein each of the plurality of second memory elements includes a memristor.

6. The memory array structure of claim 1, wherein the plurality of first memory structures and the plurality of second memory structures are coupled to a common analog-to-digital converter (ADC).

7. The memory array structure of claim 1, wherein the plurality of first memory structures is coupled to a first analog-to-digital converter (ADC) and the plurality of second memory structures is coupled to a second ADC.

8. The memory array structure of claim 1, wherein each selector comprises:
   a first diode comprising a first anode coupled to the second end of the corresponding second memory element and a first cathode coupled to the first end of the second transistor; and
   a second diode comprises a second cathode coupled to the second end of the corresponding second memory element and a second anode coupled to the first end of the second transistor.

9. A memory array structure, comprising:
   a word array, storing an N-bit word and comprising:
      a plurality of first memory structures, wherein each first memory structure comprises a first transistor and a first memory element, the first transistor is coupled to a first select line, and the first memory element is coupled to a first bit line; and
      a plurality of second memory structures, wherein each second memory structure comprises a second transistor and a plurality of second memory elements, each second memory element is coupled to a corresponding second bit line, and the second transistor is coupled to a second select line.

10. The memory array structure of claim 9, wherein the plurality of first memory structures stores a plurality of most significant bits (MSB) of the N-bit word, and the plurality of second memory structures stores least significant bits (LSB) of the N-bit word.

11. The memory array structure of claim 9, wherein the plurality of first memory structures stores a number of first bits of the N-bit word, the plurality of second memory structures stores a number of second bits of the N-bit word, and the number of first bits is less than the number of second bits.

12. The memory array structure of claim 9, wherein each of the plurality of second memory elements includes a memristor.

13. The memory array structure of claim 9, wherein the plurality of first memory structures and the plurality of second memory structures are coupled to a common analog-to-digital converter (ADC).

14. The memory array structure of claim 9, wherein the plurality of first memory structures is coupled to a first analog-to-digital converter (ADC) and the plurality of second memory structures is coupled to a second ADC.

15. The memory array structure of claim 9, wherein each second memory structure further comprises a plurality of selectors, each selector is coupled between the corresponding second memory element and the second transistor.

16. A method for operating a memory structure, comprising:
- receiving, through a first bit line coupled to a first memory element of the memory structure, a first bit line signal;
- receiving, through a second bit line coupled to a second memory element of the memory structure, a second bit line signal; and
- receiving, through a select line coupled a transistor of the memory structure, a first select line signal, wherein a difference of a magnitude of the first bit line signal and a magnitude of the select line signal is significantly equal to two times a magnitude of the second bit line signal.

17. The method of claim 16, wherein the magnitude of the first bit line signal is greater than the magnitude of the select line signal.

18. The method of claim 16, wherein the magnitude of the first bit line signal is less than the magnitude of the select line signal.

19. The memory array structure of claim 1, wherein the three second memory elements are coupled to three-bit lines.

20. The memory array structure of claim 1, wherein the plurality of second memory elements includes three second memory elements.

* * * * *